March 30, 1965 H. R. CHALIFOUR 3,175,274

METHOD FOR APPLYING ELECTRODES TO SEMICONDUCTOR DEVICES

Original Filed May 20, 1960 2 Sheets-Sheet 1

INVENTOR.
Henri R. Chalifour

BY Wilfred G. Caldwell

ATTORNEY

March 30, 1965 H. R. CHALIFOUR 3,175,274

METHOD FOR APPLYING ELECTRODES TO SEMICONDUCTOR DEVICES

Original Filed May 20, 1960 2 Sheets-Sheet 2

INVENTOR.
Henri R. Chalifour
BY Wilfred G. Caldwell
ATTORNEY 3,175,274

METHOD FOR APPLYING ELECTRODES TO SEMICONDUCTOR DEVICES

Henri R. Chalifour, Lawrence, Mass., assignor to Columbia Broadcasting System, Inc., Danvers, Mass., a corporation of New York Original application May 20, 1960, Ser. No. 30,685. Divided and this application July 19, 1961, Ser. No. 127,440

5 Claims. (Cl. 29—25.3)

The present invention relates generally to a method and apparatus for the processing of semiconductor devices, and in particular to a process and jig or fixture for the mass production manufacture of transistors of the type including a semiconductor body and respective emitter and collector contacts alloyed to the opposite faces of the body. This is a division of my co-pending application, Serial No. 30,685, filed on May 20, 1960, now abandoned.

An alloyed semiconductor assembly usually includes a body or wafer of semiconductor material, such as of germanium, having alloyed to one face thereof a centrally disposed emitter having an emitter contact or lead connected thereto and an annular base ring surrounding the emitter and likewise alloyed to the one face of the wafer or body. Such assembly is completed by the alloying of a collector to the opposite face of the body or wafer. Fixtures and jigs are available for the assembly of the several components of such semiconductor devices, but in general such fixtures are rather complicated in construction and involve the use of a number of separable component parts to establish and maintain a desired orientation between the several components of the semiconductor device. Further, the need for constant assembly and disassembly of the component parts of the fixture cause wear and loss of tolerances in their fit such that it is difficult to maintain a precise orientation between the several components of semiconductor device with repeated use of the fixture.

Broadly, it is an object of the present invention to provide an improved method and apparatus for the assembly of semiconductor devices which obviate one or more of the aforesaid difficulties. Specifically, it is within the contemplation of the present invention to provide an improved process and apparatus for the assembly of a plurality of alloyed junction semiconductor devices on a mass production basis, with the reasonable assurance of a high order of control over the orientation of the several components during the alloying of such devices.

In accordance with an illustrative apparatus demonstrating objects and features of the present invention, there is provided a fixture which comprises a lower tray, an upper tray and means for maintaining the lower and upper trays in a prescribed orientation. A lower insert is mounted in the lower tray for a limited vertical adjustment and an upper insert is likewise mounted in the upper tray for limited vertical adjustment. The lower and upper inserts are disposed in end to end alignment and are adapted to sandwich a semiconductor wafer or body therebetween. Respective means are provided on the lower and upper inserts for supporting the parts to be assembled with the semiconductor body in assembled relation therewith. The respective upper and lower inserts, which adjust or float, accommodate to the dimensional tolerances encountered in the components of the semiconductor device, such as slight variations in thickness of the semiconductor body and variations in the thickness of the respective contacts which are to be alloyed to such semiconductor body. In typical apparatus, a plurality of pairs of lower and upper inserts are provided in the lower and upper trays, with provision for the individual mounting of the inserts for adjustment such that each individual pair of lower and upper inserts may adjust to maintain the desired relationship between the component parts of the semiconductor device during processing.

In accordance with an illustrative method, a transistor of the type including a semiconductor body and emitter and collector pellets which are adapted to be joined to opposite faces of the body are assembled by initially assembling the body over and in contact with the emitter pellet which rests on an emitter contact. Thereupon the subassembly is sandwiched between the respective inserts serving as floating holding members to establish intimate contact between the body and the emitter pellet. The subassembly is inverted such that the emitter pellet and a base connection or ring to the semiconductor body are urged by the force of gravity to rest against the adjacent surface of the semiconductor body, and the emitter contact is urged to rest against the emitter pellet. The subassembly is heated at a temperature and for a period sufficient to alloy the emitter pellet to the contact and the body, and the base ring to the body. Following the alloying step, the subassembly is reinverted to bring the face of the body remote from the emitter contact uppermost whereupon the collector pellet is assembled over and resting against the uppermost face of the semiconductor body. As a final step, the body is again heated at a temperature and for a period sufficient to alloy the collector pellet to the body. As is generally understood, further processing in accordance with well understood techniques are employed to complete the semiconductor device, as by encapsulating the same in an apropriate package and the like.

The above brief description, as well as further objects and features of the present invention, will be more fully appreciated by reference to the following detailed description of an illustrative apparatus and process in accordance with the present invention, when taken in conjunction with the accompanying drawings, wherein.

Figures 1, 2:
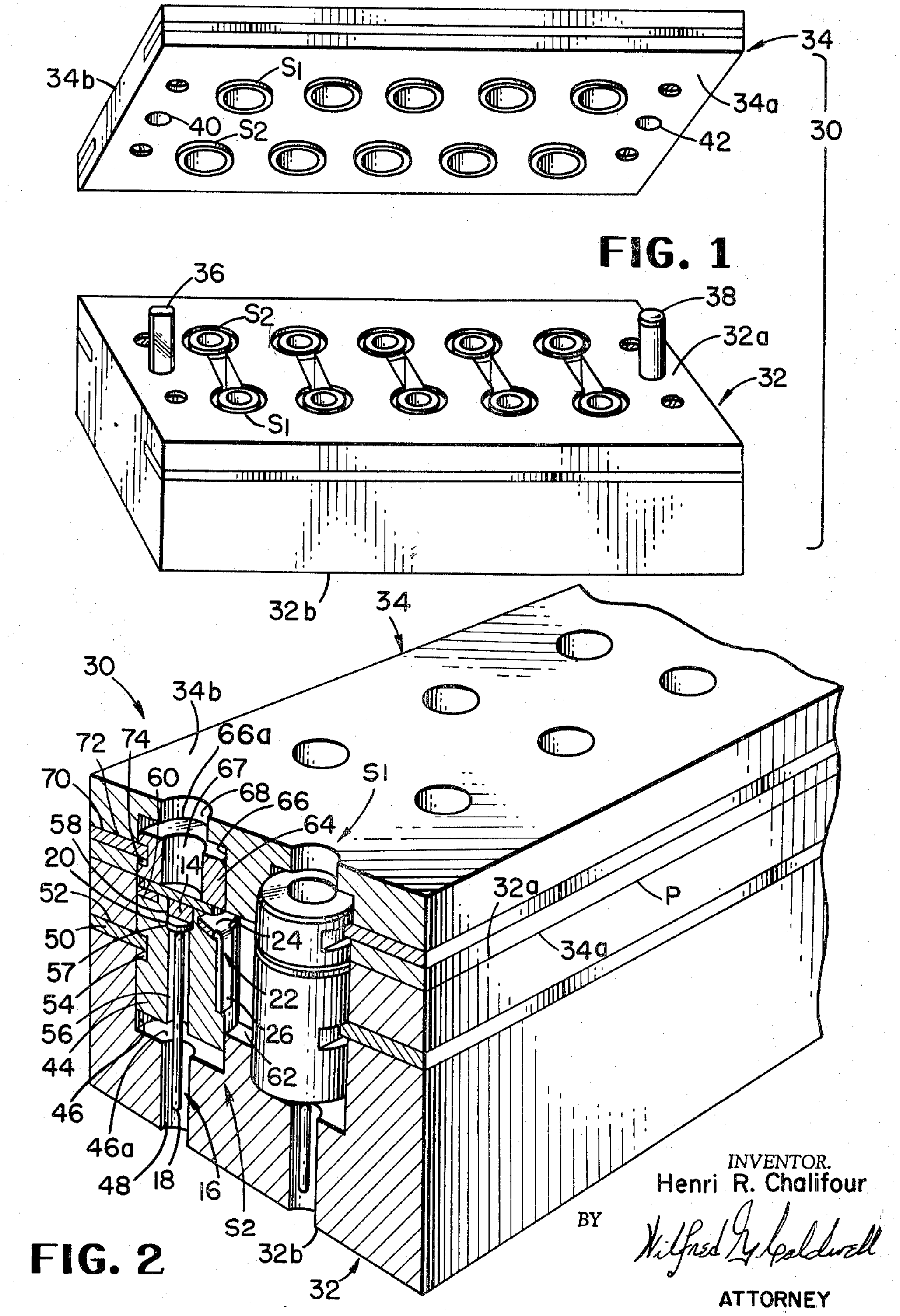
FIG. 1 is an exploded perspective view of a fixture for the processing of semiconductor devices in accordance with the present invention, shown with the upper tray or section of the fixture removed from the lower tray or section thereof.
FIG. 2 is a perspective view of the fixture shown in FIG. 1 as assembled, with parts broken away and sectioned to show the internal construction of the fixture.

Preliminary to a detailed description of illustrative apparatus and a typical process in accordance with the present invention as illustrated in FIGS. 1 to 6 in the drawings, reference will be made to FIG. 7 of the drawings wherein there is shown a typical, but nonetheless illustrative, alloyed junction transistor, generally designated by the reference numeral 10, which may be manufactured in accordance with the apparatus and method aspects of the present invention. The transistor 10 includes a body wafer 12 of semiconductor material, as of germanium. Alloyed to one face of the semiconductor 12 is an emitter pellet 14, as of indium, silver or gallium, which has joined to the body at junction 14a. Secured to the emitter pellet 14 is an emitter contact 16 including an elongated lead 18 and enlarged head 20. Surrounding the emitter pellet 14 is a base contact 22 which includes a base ring 24 bonded to the semiconductor body 12 and a base lead 26 projecting downwardly from the base ring 24 and extending substantially parallel to the emitter lead 18. Alloyed to the opposite face of the semiconductor body 12 is a collector pellet 27, as of pure indium, which is joined to the body 12 at the junction 27a. The alloy junction transistor 10 is intended to be purely illustrative and it will be appreciated, as the detailed description proceeds, that the apparatus and method disclosed herein may be employed to manufacture a wide variety of similar semiconductor devices.

Referring now specifically to FIGS. 1 and 2, there is shown an illustrative apparatus or fixture embodying features of the present invention, generally designated by the reference numeral 30, which includes a lower tray or section 32 and an upper tray or section 34. Such trays or sections may be fabricated of carbon, or for the purposes of prolonging life, may be of stainless steel. Provision is made for mounting the upper tray 34 on the lower tray 32 in a prescribed registry therewith and with the confronting faces 34a, 32a abutting or meeting at a parting plane, generally designated by the reference letter P in FIG. 2. In this illustrative embodiment, the lower tray 32 carries adjacent its opposite ends a pair of aligning pins or plugs 36, 38 which project upwardly from the upper face 32a of the tray 32 and are received in respective openings or pin bores 40, 42 provided in the lower face 34a of the upper tray 34.

Figure 7:
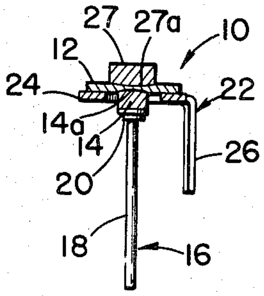

The fixture 30 is provided with a plurality of processing stations for the assembly and alloying of alloyed junction transistors of the type illustrated in FIG. 7. In this illustrative embodiment, the fixture 30 is illustrated as including ten processing stations arranged in two parallel rows each including five stations, with the stations adjacent the left end of the fixture (as shown in FIG. 1) being designated by the reference characters $S_1$, $S_2$. Each of the stations includes cooperating parts mounted respectively on the lower and upper trays or sections 32, 34 of the fixture 30 and is of identical constructions. Accordingly, a detailed description of any one of the processing stations, such as the station $S_2$, is equally applicable to all of the stations. Specifically (as shown in FIG. 2), the station $S_2$ includes a lower insert or holding member 44 of cylindrical form which is received within a bore 46 formed in the lower section 32. The bore 46 or slideway for the cylindrical insert or holding member 44 extends downwardly from the upper face 32a of the lower section 32 and terminates in a bottom wall 46a spaced from the undersurface 32b of the lower section 32. Intermediate the bottom wall 46a of the bore or guideway 46 and the bottom 32b of the section 32, there is provided a clearance hole 48 for the lead 18.

Means are provided for mounting the insert or holding member 44 for limited vertical adjustment within the lower tray 32. In this illustrative embodiment, the means includes a key 50 which extends longitudinally of the lower section 32 of the fixture 30 and is received in an appropriately cut slot 52 in the wall of the section 32 intermediate the bottom wall 46a of the bore 46 and the upper face of the section 32a. The key 50 projects into the guideway or bore 46 and is received within a keyway 54 formed in the adjacent segment of the insert 44. The keyway 54 is of an overall width to be somewhat larger than the vertical height of the key 50 such that the insert 44 may have a limited vertical adjustment or floating action, for a purpose to be described.

The insert 44 is formed with a first axial bore 56 which extends upwardly from the lower end thereof and terminates at a point spaced from the upper end thereof in a contact seat 57. The axial bore 56 is adapted to receive the elongated lead 18 of the emitter contact 16, with the enlarged head 20 thereof resting upon the appropriate dimensioned contact seat 57.

The insert or holding member 44 is further formed with a second axial bore 58 which extends downwardly from the upper end thereof and terminates at the contact seat 57. The second axial bore 58 is of a cross section to snugly receive and contain the emitter pellet 14 and orients the same to rest against the enlarged head 20 of the emitter contact 16. The depth of the bore 58 is selected such that the emitter pellet 14 has its upper face substantially coplanar with the upper face of the insert 44. The upper face of the insert 44 is formed with an annular base ring seat 60 which is appropriately dimensioned to accommodate the base ring 24 of the base contact 22, it being appreciated that the outer diameter of the base ring 24 is substantially comparable to the outer diameter of the insert 44 and that the overall depth of the seat 60 is substantially equal to the thickness of the base ring 24. Still further, the portion of the lower section 32 at the side opposite the key 50 and intermediate the adjacent assembly stations S1, S2 is cut away, as indicated at 62, to accommodate the lead 26 of the base contact 22.

Mounted within the upper tray or section 34 is a second insert or holding member 64 which is superposed above the first insert or holding member 44 when the fixture is assembled (as shown in FIG. 2) such as to be in axial alignment therewith. The insert or holding member 64 is cylindrical in form and is accommodated within a bore or guideway 66 which extends upwardly from the lower face 34a of the section 34 and terminates at a base wall 66a at a location spaced from the top wall 34b of the section 34. A first axial loading bore 67 is formed through the insert 64 as shown. Extending between the top wall 34b and the base wall 66a of the guideway 66 is a second loading bore or opening 68. Through bore 67 and 68 the collector pellet 27 may be inserted, as will be subsequently described.

Means are provided for mounting the insert 64 within the guideway 66 for limited vertical adjustment which means includes a key 70 accommodated within a slot 72 cut lengthwise of the top section 34. The key 70 projects into the guideway 66 and is accommodated within a keyway 74 formed in the adjacent segment of the cylindrical insert 64. The keyway 74 is somewhat greater in width than the thickness of the key 70 such as to provide for the necessary limited vertical adjustment of the insert 64 relative to upper tray or section 34.

Figure 3:
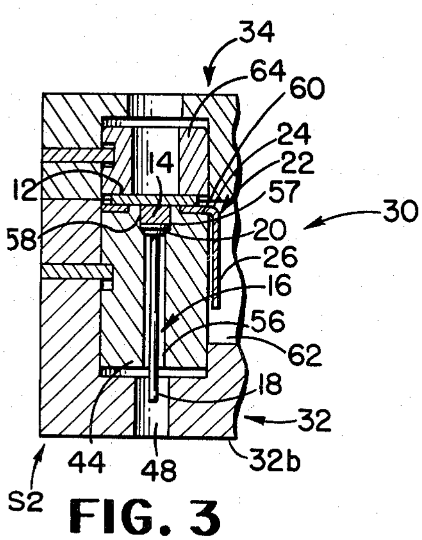
FIG. 3 is a fragmentary longitudinal section taken through one assembly station of the fixture, with the subassembly of an emitter contact, emitter, base ring and semiconductor body of a typical semiconductor device therein during a first stage of processing in accordance with the present invention.

Further details of the illustrative apparatus will be best appreciated by now referring to FIGS. 3 to 6 inclusive of the drawings which illustrate the loading of the processing station $S_2$ and the orientation of the fixture and of the parts at station $S_2$ during a typical sequence of processing in accordance with the present invention:

Initially, the lower tray 32 is arranged to rest on the wall 32b and the upper tray 34 is removed as seen in FIG. 1. Thereupon (as shown in FIGS. 2 and 3) the emitter contact 16 is loaded into the accommodating bore 56 of the insert 44, with the elongated lead 18 thereof projecting downwardly into the bore 56 and into the clearance opening 48 and with the enlarged head 20 resting on the contact seat 57. Thereupon the emitter pellet 14 is loaded into the bore 58 such that the undersurface of the emitter pellet rests against the substantially coextensive surface of the head 20 of the emitter contact 16. The base contact 22 is then assembled into position, with the lead 26 thereof projecting into the clearance opening 62 and with base ring 24 being seated on the base ring seat 60 in the upper face of the insert 44. This subassembly is completed by placing the germanium wafer 12 in position overlying and resting against the emitter pellet 14 and the concentric base ring 24. Intimate contact may not be established at this point between the semiconductor body 12 and the emitter 14 and/or the base ring 24 due to minor variations in the thicknesses of the parts. Thereupon, the upper tray 34 is brought into the required registered relation with the lower tray 32 by assembly of the pins 36, 38 through the aligning bores 40, 42 at which time the upper insert 64 will come to bear against the face of the semiconductor body 12 remote from the contacts 16, 22.

Figure 4:
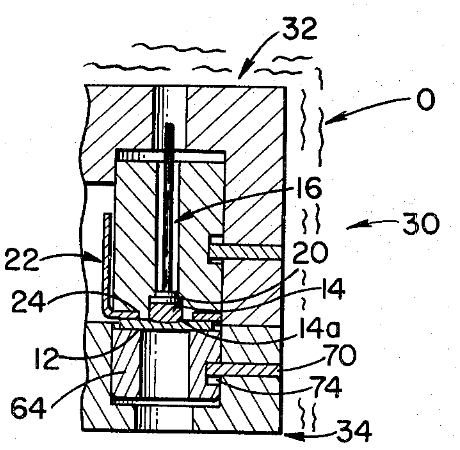
FIG. 4 is a fragmentary longitudinal elevational view similar to FIG. 3 but showing the fixture and sub-assembly inverted during passage through an alloying oven while being processed in accordance with the present invention.

With the lower and upper trays 32, 34 assembled, the fixture 30 is inverted, as shown in FIG. 4, at which time the insert 64 will drop to the limit position established by its key 70 in keyway 74 and intimate contact will be established between the head 20 of the emitter contact 16 and the emitter pellet 14 and between the emitter pellet 14 and the semiconductor body 12 and between the base ring 24 of the base contact 22 and the semiconductor body 12. In this inverted condition, the fixture is passed through an alloying oven, generally designated by the letter O, at a temperature and for a period sufficient to alloy the several components of the assembly together. An essentially resistive connection will be provided between the emitter contact 16 and the emitter 14, a rectifying area junction 14*a* will be formed between the emitter 14 and the semiconductor body 12 due to the alloying of the emitter material into the semiconductor body, and an essentially resistive connection will be provided between the base contact 22 and the semiconductor body 12. When using indium, silver, or gallium as the emitter material, the alloy may be at a temperature between 550° C. and 580° C. for approximately forty-five minutes.

Figure 5:
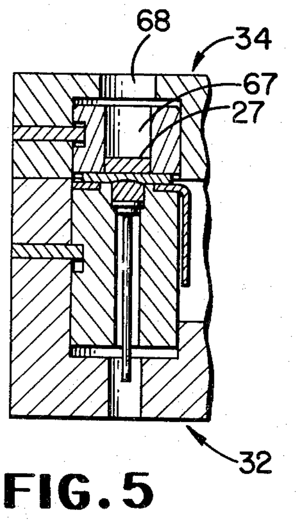
FIG. 5 is a fragmentary longitudinal sectional view similar to FIG. 3, after alloying and with a collector assembled with the sub-assembly.
Figure 6:
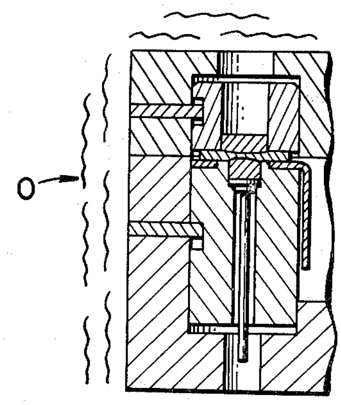
FIG. 6 is a view similar to FIG. 5 during the passage of the fixture through the alloying oven during a second alloying pass; and, FIG. 7 is a perspective view, with parts sectioned, showing a typical alloyed junction transistor processed in accordance with the present invention.

After passage through the alloying oven O, the fixture 30 is reinverted (as shown in FIG. 5) to bring the section 32 lowermost and the collector pellet 27 is loaded into position, being dropped through the loading openings 67 and 68. A weight may be loaded onto the collector pellet 27 in the event that a relatively flat collector junction is desired or required.

After loading the collector pellet 27, the fixture, without being reinverted, is again passed through the alloying oven O at a temperature and for a time sufficient to alloy the collector pellet 27 to the semiconductor body 12. In a typical process using pure indium as the collect pellet, the processing temperature may be at 520° C. for a period of approximately 45 minutes.

After this final stage of processing, the sections 32, 34 of the fixture are separated and the completed alloy junction assembly or assemblies 10 are removed from the respective work stations S.

It will of course be appreciated that variations in dimensions of the component parts at the individual stations will be random and essentially independent of each other; and therefore the respective pairs of floating holding members 44, 64 may assume different relative positions depending upon the dimensions of the parts interposed therebetween during processing. Due to the inherent simplicity of the several loading steps required for the processing with the present fixture, it is readily possible to perform the several loading and alloying operations on an assembly line basis to achieve mass production of alloy junction semiconductor devices at a relatively low unit cost.

A latitude of modification, substitution and change is intended in the foregoing apparatus and method and accordingly it is within the contemplation of the invention that the claims be construed broadly and in a manner consistent with the spirit and scope of the disclosure set forth therein.

What I claim is:

1. A method for the assembly of a transistor of the type including an emitter, a semiconductor body and a collector comprising the steps of supporting said emitter, assembling said body over and in contact with said emitter to form a sub-assembly including said emitter and semiconductor body, inverting the sub-assembly such that said emitter bears with the force of gravity against said body, heating said sub-assembly at a temperature and for a period sufficient to alloy said emitter to said body, reinverting said sub-assembly such as to bring the face of said body remote from said emitter uppermost, assembling said collector over and resting against said face of said body, and heating the final assembly at a temperature and for a period sufficient to alloy said collector to said body.

2. A method for the assembly of a transistor of the type including an emitter, a base ring, a semiconductor body and a collector comprising the steps of supporting said emitter, assembling said base ring about said emitter, assembling said body over and in contact with said emitter and base ring to form a sub-assembly including the emitter, base ring and semiconductor body; bringing a force to bear against said semiconductor body, inverting the sub-assembly such that said emitter and base ring bear with the force of gravity against said body, heating said sub-assembly at a temperature and for a period sufficient to alloy said emitter and base ring to said body, reinverting said sub-assembly such as to bring the face of said body remote from said emitter and base ring uppermost, assembling said collector over and resting against said face of said body, and heating the final assembly at a temperature and for a period sufficient to alloy said collector to said body.

3. A method for the assembly of a transistor of the type including an emitter contact, an emitter, a base ring, a semiconductor body and a collector comprising the steps of supporting said emitter contact, assembling said emitter over and resting against said emitter contact, assembling said base ring about said emitter, assembling said body over and in contact with said emitter and base ring to form a sub-assembly including the emitter contact, emitter, base ring and semiconductor body; bringing a force to bear against said semiconductor body, inverting the sub-assembly such that said emitter contact bears with the force of gravity against said emitter and such that said emitter and base ring bear with the force of gravity against said body, heating said sub-assembly at a temperature and for a period sufficient to alloy said emitter contact to said emitter and said emitter and base ring to said body, reinverting said sub-assembly such as to bring the face of said body remote from said emitter and base ring uppermost, assembling said collector over and resting against said face of said body, and heating the final assembly at a temperature and for a period sufficient to alloy said collector to said body.

4. A method for the assembly of a semiconductor device of the type including a semiconductor body and at least a pair of contacts adapted to be joined to opposite faces of said body comprising the steps of assembling said body over and in contact with one of said contacts to form a sub-assembly including the semiconductor body and one of said contacts, sandwiching the sub-assembly between a pair of floating holding members to establish intimate contact between said body and said contact, inverting said sub-assembly such that said contact bears with the force of gravity against said body, heating said sub-assembly at a temperature and for a period sufficient to alloy said one contact to said body, reinverting said sub-assembly so as to bring the face of said body remote from said one contact uppermost, assembling the other contact over and resting against said face of said body, and heating the final assembly at a temperature and for a period sufficient to alloy said other contact to said body.

5. A method for the assembly of a transistor of the type including a semiconductor body and emitter and collector contacts adapted to be joined to opposite faces of said body comprising the steps of assembling said body over and in contact with said emitter contact to form a sub-assembly including the semiconductor body and emitter contact, sandwiching the sub-assembly between a pair of floating holding members to establish intimate contact between said body and said emitter contact, inverting said sub-assembly such that said emitter contact bears with the force of gravity against said body, heating said sub-assembly at a temperature and for a period sufficient of floating holding members to establish intimate contact said sub-assembly so as to bring the face of said body remote from said emitter contact uppermost, assembling said collector contact over and resting against said face of said body, and heating the final assembly at a temperature and for a period sufficient to alloy said collector contact to said body.

References Cited by the Examiner

UNITED STATES PATENTS

| | | | |
|---|---|---|---|
| 2,756,483 | 7/56 | Wood | 29—25.3 |
| 2,913,642 | 11/59 | Jenny | 29—25.3 X |
| 2,981,875 | 4/61 | Kelly et al. | 29—25.3 X |
| 3,073,006 | 1/63 | New | 25—25.3 |

FOREIGN PATENTS

| | | |
|---|---|---|
| 740,419 | 11/55 | Great Britain. |

RICHARD H. EANES, Jr., *Primary Examiner.*

LEON PEAR, *Examiner.*